United States Patent
Ramaswamy et al.

(10) Patent No.: US 7,115,489 B2
(45) Date of Patent: Oct. 3, 2006

(54) METHODS OF GROWING EPITAXIAL SILICON

(75) Inventors: Nirmal Ramaswamy, Boise, ID (US); Cem Basceri, Reston, VA (US)

(73) Assignee: Micron Technology, Inc., Boise, ID (US)

( * ) Notice: Subject to any disclaimer, the term of this patent is extended or adjusted under 35 U.S.C. 154(b) by 151 days.

(21) Appl. No.: 10/892,651

(22) Filed: Jul. 16, 2004

(65) Prior Publication Data
US 2006/0011130 A1    Jan. 19, 2006

(51) Int. Cl.
*H01L 21/20* (2006.01)
(52) U.S. Cl. .................. 438/503; 257/E21.132; 257/E21.461

(58) Field of Classification Search ............ None
See application file for complete search history.

(56) References Cited

U.S. PATENT DOCUMENTS

| | | | |
|---|---|---|---|
| 4,401,687 A * | 8/1983 | Rosler et al. | 427/574 |
| 5,073,516 A * | 12/1991 | Moslehi | 438/429 |
| 6,680,229 B1 | 1/2004 | Nuttall et al. | |
| 6,696,713 B1 | 2/2004 | Ishibashi | |

FOREIGN PATENT DOCUMENTS

JP          11233518 A * 8/1999

* cited by examiner

*Primary Examiner*—Asok Kumar Sarkar
(74) *Attorney, Agent, or Firm*—Dinsmore & Shohl LLP

(57) ABSTRACT

Methods for growing epitaxial silicon are provided. Methods for controlling bottom stacking fault propagation in epitaxial silicon are also provided.

60 Claims, 5 Drawing Sheets

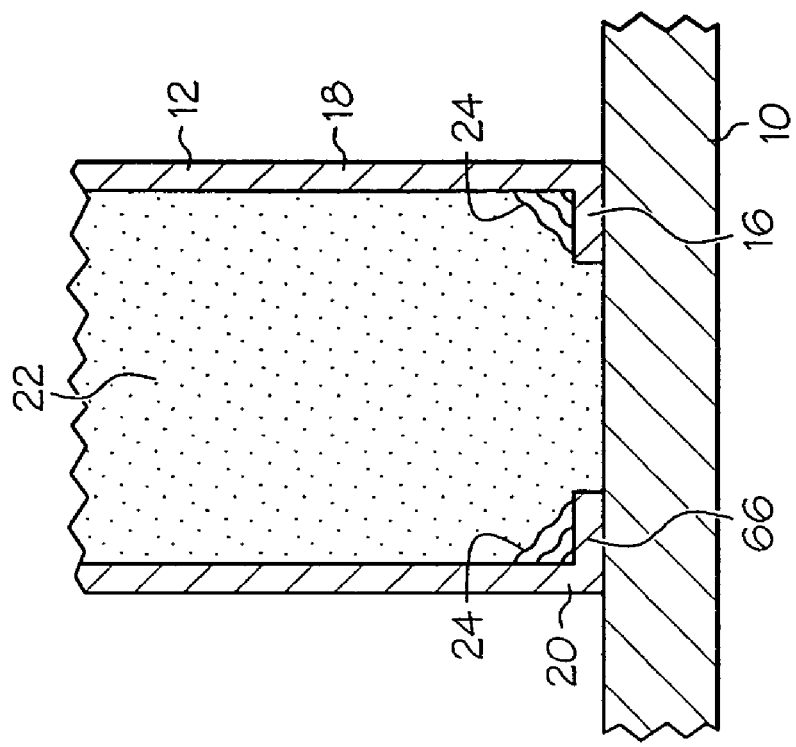
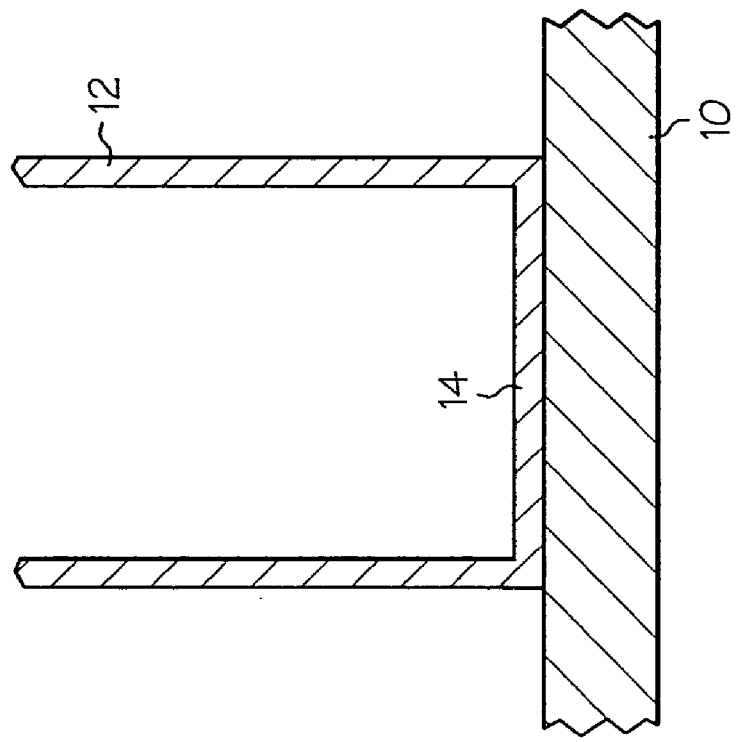
FIG. 1B
FIG. 1A

METHODS OF GROWING EPITAXIAL SILICON

FIELD OF THE INVENTION

The present invention relates to methods of growing epitaxial silicon, and more particularly, to methods for controlling bottom stacking fault propagation during selective epitaxial growth of silicon during vertical transistor fabrication.

BACKGROUND OF THE INVENTION

Epitaxial silicon is used in a variety of semiconductor devices when a pure silicon layer is required. Selective epitaxial growth of silicon in a vertical transistor is one such device. Epitaxial silicon is grown on a substrate and exhibits the same crystal structure as the substrate on which it is grown. Dislocations and stacking faults, which form during epitaxial silicon growth, are primary concerns as they are electrically active due to the presence of dangling bonds and lead to numerous problems. Such problems include, but are not limited to, unnecessary recombination generation currents, lower breakdown voltages, high leakage and larger junction ideality factors.

In contrast with dislocations, which primarily lie on the surface of epitaxial silicon, stacking faults extend into the surface and can originate at the bottom and/or sidewalls of a container structure during epitaxial silicon growth. Stacking faults that originate at the bottom and propagate all the way to the surface of a column of epitaxial silicon will lead to leakage of charge from the capacitor and also provide an alternate path for electrons to travel through the transistor. These defects need to be effectively controlled for a vertical transistor to function.

Thus, there remains a need for selectively growing epitaxial silicon which controls the direction of propagation of bottom stacking faults. In addition, there remains a need to reduce the number of stacking faults that propagate all the way through to the surface of a column of selectively grown epitaxial silicon.

SUMMARY OF THE INVENTION

These needs are met by embodiments of the present invention that provide methods of growing epitaxial silicon and methods for controlling bottom stacking fault propagation in epitaxial silicon that is grown, for example, as part of the fabrication of a vertical transistor.

In accordance with one embodiment of the present invention, a method of growing epitaxial silicon is provided. The method comprises: providing a silicon substrate that supports a container comprising a liner, wherein the liner is over the silicon substrate; etching the base of the liner to create a confining tab and to expose the silicon substrate; and growing silicon epitaxially in the container.

In accordance with another embodiment of the present invention, a method of growing epitaxial silicon is provided. The method comprises: providing a silicon substrate that supports a container comprising a liner, wherein the liner is over the silicon substrate; etching the sidewalls and a portion of the base of the liner to create a confining tab and to expose the silicon substrate; and growing silicon epitaxially in the container.

In accordance with another embodiment of the present invention, a method of growing epitaxial silicon is provided. The method comprises: providing a silicon substrate that supports a container comprising a liner, wherein the liner is at the base of the container over the silicon substrate; etching the liner to create a confining tab and to expose the silicon substrate; and growing silicon epitaxially in the container.

In accordance with another embodiment of the present invention, a method for controlling bottom stacking fault propagation in epitaxial silicon is provided. The method comprises: providing a silicon substrate that supports a container comprising a liner, wherein the liner is over the silicon substrate; etching the base of the liner to create a confining tab and to expose the silicon substrate; and growing silicon epitaxially in the container. Bottom stacking fault propagations are controlled by the confining tab which directs such faults toward the sidewalls of the container.

In accordance with another embodiment of the present invention, a method for controlling bottom stacking fault propagation in epitaxial silicon is provided. The method comprises: providing a silicon substrate that supports a container comprising a liner, wherein the liner is over the silicon substrate; etching the sidewalls and a portion of the base of the liner to create a confining tab and to expose the silicon substrate; and growing silicon epitaxially in the container. Bottom stacking fault propagations are controlled.

In accordance with another embodiment of the present invention, a method for controlling bottom stacking fault propagation in epitaxial silicon is provided. The method comprises: providing a silicon substrate that supports a container comprising a liner, wherein the liner is at the base of the container over the silicon substrate; etching the liner to create a confining tab and to expose the silicon substrate; and growing silicon epitaxially in the container. Bottom stacking fault propagations are controlled.

Accordingly, it is a feature of the present invention to provide methods for controlling stacking faults in epitaxial silicon. This and other features and advantages of the invention will become apparent from the following detailed description and accompanying claims.

BRIEF DESCRIPTION OF THE DRAWING FIGURES

FIGS. 1A and 1B are schematic sectional views of a container and liner before and after formation of a confining tab, respectively in accordance with an embodiment of the present invention.

DETAILED DESCRIPTION OF THE PREFERRED EMBODIMENTS

Figure 2:
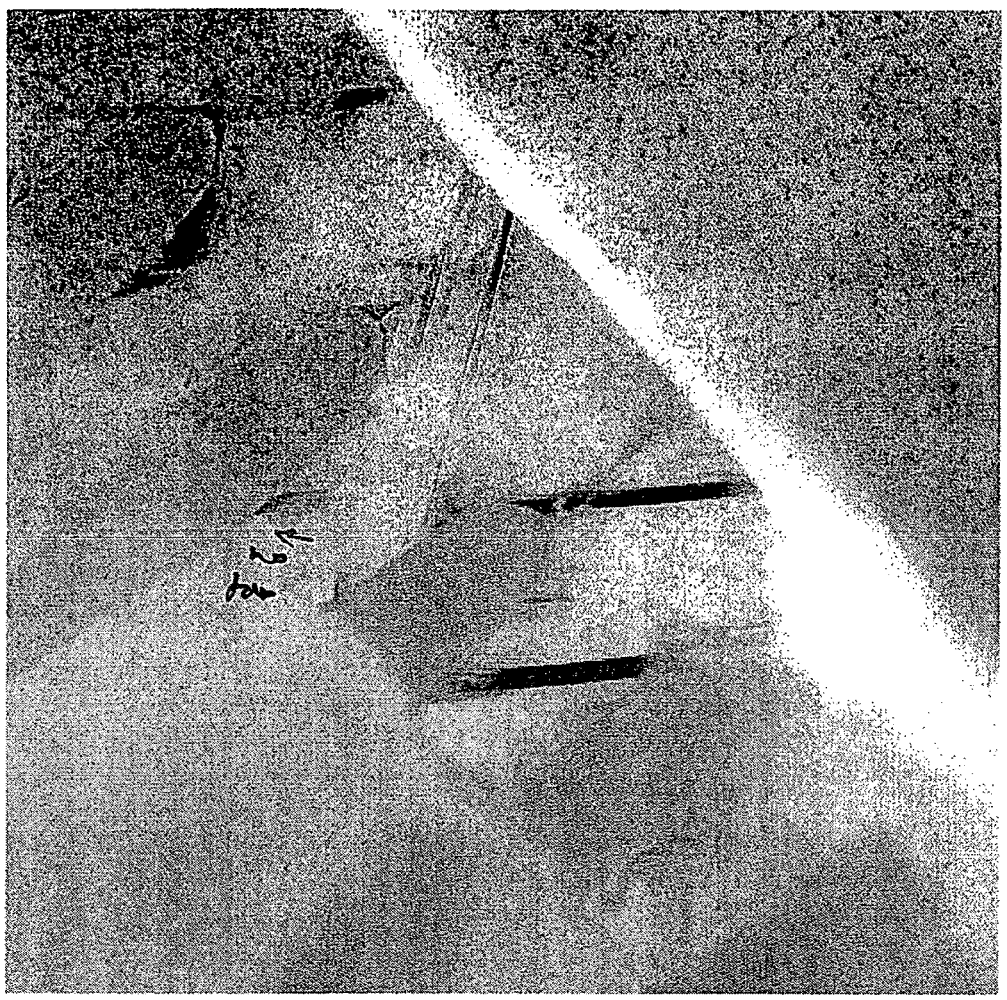
FIG. 2 depicts a Transmission Electron Microscopy (TEM) image at 200 nm of epitaxial silicon grown without a confining tab.

The present invention is directed to methods of growing epitaxial silicon and methods for controlling bottom stacking fault propagation in epitaxial silicon to prevent such stacking faults from propagating to the surface of selectively epitaxially grown structures. The methods of the present invention control stacking fault propagation in epitaxial silicon with the use of a confining tab. The confining tab leads the growth of stacking faults towards the substrate sidewalls and/or to termination of the stacking faults on themselves, thereby substantially eliminating stacking faults that propagate all of the way through the bulk epitaxial silicon to the surface. Sidewall stacking faults may be annealed, re-oxidized, or etched away to remove those faults following epitaxial silicon growth.

In the fabrication of vertical transistors, a very small diameter (approx. 0.1 μdia.) cylindrical pillar of epitaxially-grown silicon is formed. Generally, such a structure is grown in an open annular area such a a lined container. Silicon is grown upwardly from the bottom of the liner using chemical vapor deposition (CVD) techniques. Because of the very small diameter of the silicon structure, dislocations in the crystal structure such as stacking faults play a more prominent role. These dislocations occur primarily during cooling of the structure, although bottom faults are generally crystal growth related, while sidewall stacking faults tend to be formed by thermal stresses during cooling.

In the following detailed description of the preferred embodiments, reference is made to the accompanying drawings that form a part hereof, and in which are shown by way of illustration, and not by way of limitation, specific preferred embodiments in which the invention may be practiced. It is to be understood that other embodiments may be utilized and that logical, mechanical, and electrical changes may be made without departing from the spirit and scope of the present invention. In the drawings, like numerals describe substantially similar components throughout the several views.

Referring to FIGS. 1A and 1B, a method of growing epitaxial silicon and controlling bottom stacking fault propagation in epitaxial silicon is illustrated. In one embodiment, the method comprises providing a silicon substrate 10 having a container 12 comprising a liner 14, thereon. As shown in FIG. 1B, the base 20 of the liner 14 is etched in a central location thereof to create a confining tab 16 and to expose the silicon substrate 10. Epitaxial silicon 22 is grown in the container 12. For purposes of defining and describing the invention, the term "substrate" refers to any composition or construction comprising semiconductive material, including, but not limited to, bulk semiconductive material such as a semiconductive substrate, either alone or in assemblies comprising other materials thereon, and semiconductive material layers, either alone or in assemblies comprising other materials. One skilled in the art will appreciate that there are various materials of which substrate 10 may be composed in accordance with the present invention, any of which may be employed herein. In one embodiment, substrate 10 is composed of a material selected from the group consisting of doped single crystal silicon, undoped single crystal silicon, epitaxial silicon, polysilicon, and amorphous silicon.

The silicon substrate 10 supports a container 12 comprising a liner 14. One skilled in the art will appreciate the various materials which may be used for liner 14, any of which may be employed herein. Suitable materials include, but are not limited to, metal oxides and metal nitrides. In one embodiment, the container 12 is over the silicon substrate 10 and includes sidewalls 18 and base 20.

Container 12 is formed on substrate 10 using conventional techniques. Container 12 having liner material 14 is etched to create a confining tab 16 and to expose the silicon substrate 10. In one embodiment, the base 20 of the container is etched. In another embodiment, the sidewalls 18 and a portion of the base 20 of the container are etched. One skilled in the art will appreciate the various methods which may be used to etch the liner material 14, any of which may be employed herein. In one embodiment, the silicon substrate 10 is exposed by an isotropic etch of the liner material 14. Moreover, one skilled in the art will appreciate the various amounts the liner material 14, including the base 20 and/or sidewalls 18 of container 12, may be etched to create the confining tab 16 and to expose the silicon substrate 10. From about 10%–90% of the base and/or sidewalls of the liner may be removed. Alternatively, the base 20 of the container may be etched to create confining tab 16 which extends from the sidewalls 18 for from about 10Å to about 100Å to create a generally circular opening having a diameter of from about 0.05μ to about 0.15μ, and preferably about 0.1μ.

Once the liner material 14 is etched to create a confining tab 16 and to expose the silicon substrate 10, epitaxial silicon 22 is grown in the container 12. One skilled in the art will appreciate the various methods for growing silicon epitaxially 22 in the container 12, any of which may be employed herein. For example, the epitaxial silicon 22 may be grown using a suitable chemical vapor deposition (CVD) method. It will be under stood that "epitaxial silicon" may be used to refer to epitaxial silicon or epitaxial polysilicon that is grown on silicon or polysilicon areas respectively.

In a preferred embodiment, a plasma is formed from a gas flow and the exposed portion of silicon substrate 10 is exposed to the plasma before growing silicon epitaxially in the container. In such an embodiment, the gas flow comprises an etchant gas. The etchant gas is selected to contain a species that may be ionized in the plasma. For example, the etchant gas may be a gas containing a halogen. Suitable etchant gases include, but are not limited to, $F_2$, $Cl_2$, $CF_4$, $SF_6$, and the like. One skilled in the art will appreciate the various lengths of time for which the silicon substrate 10 is exposed to the plasma, any of which may be employed herein. In one embodiment, the silicon substrate 10 is exposed to the plasma from about 1 to about 2 minutes. The plasma may be formed in a processing chamber, and the silicon substrate 10 may also be provided in a processing chamber. For example, the silicon substrate 10 may be provided in a single silicon substrate processing chamber. Alternatively, the silicon substrate 10 may be provided in a batch processing chamber. Subsequent epitaxial silicon growth, as described above, may be carried out in the same or a different processing chamber as the exposure of the silicon substrate 10 to the plasma. In one embodiment, the epitaxial silicon growth is carried out in the same processing chamber.

The present invention is also directed to methods for controlling bottom stacking fault propagation in epitaxial silicon. Referring again to FIGS. 1A and 1B, the method comprises providing a silicon substrate 10 that supports a container 12 comprising a liner material 14, wherein the liner 14 is over the silicon substrate 10; etching the base 20 of the container 12 to create a confining tab 16 and to expose the silicon substrate 10; and growing silicon epitaxially 22 in the container 12. Bottom stacking fault propagations 24 are controlled by driving such faults toward sidewalls 18 of the container 12, by terminating the stacking faults 24 on themselves, or combinations thereof. After the epitaxial silicon has been grown, one skilled in the art will appreciate the various methods for removing the stacking faults 24 which have been driven to the sides walls 18 of the container 12, any of which may be employed herein. Examples of such methods include, but are not limited to, annealing out, re-oxidizing, or etching out the stacking faults 24.

In order that the invention may be more readily understood, reference is made to the following examples, which are intended to be illustrative of the invention, but are not intended to be limiting in scope.

EXAMPLES

Example 1

Figure 3:
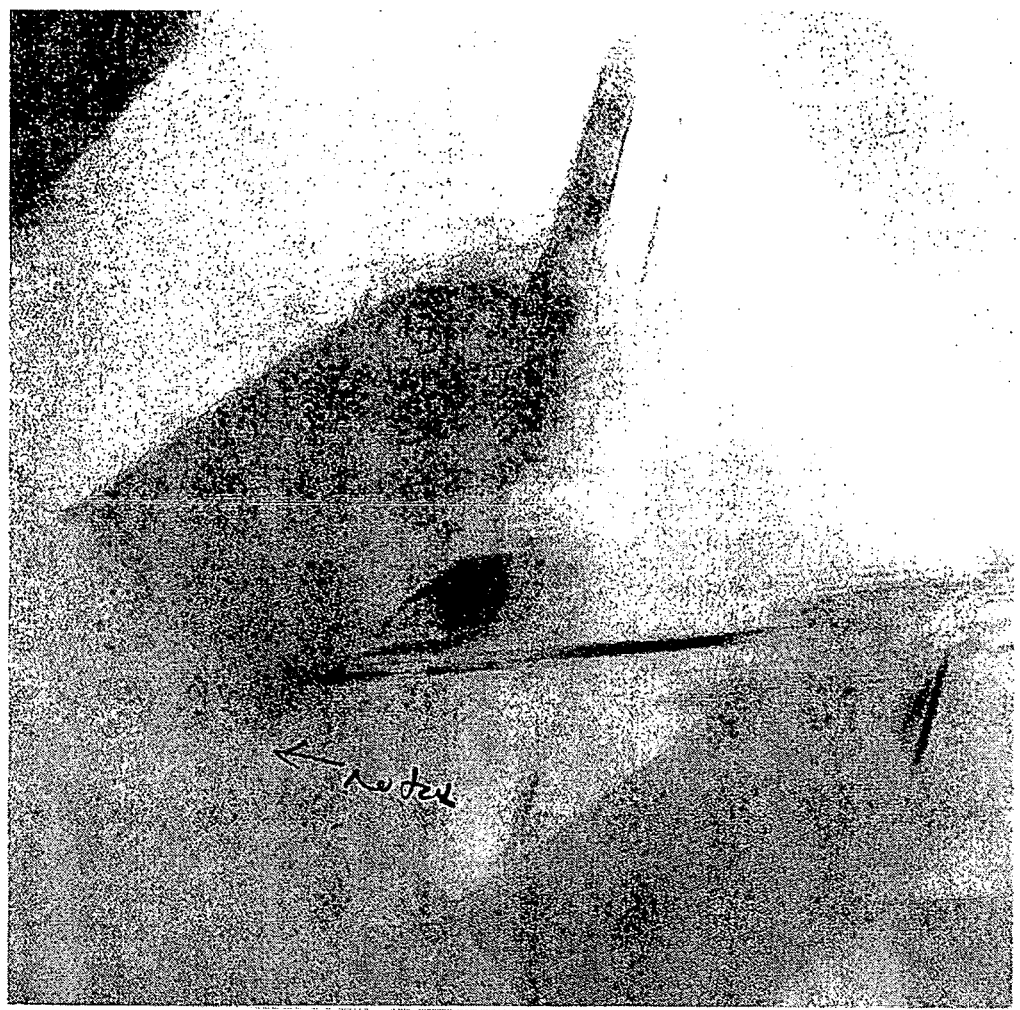
FIG. 3 depicts a TEM image at 50 nm of epitaxial silicon grown without a confining tab.

Epitaxial silicon is grown in a container without confining tabs. As illustrated in FIGS. 2–3 bottom stacking faults are formed, some of which propagate all the way through the epitaxial silicon structure to its surface.

Example 2

Figure 4:
FIG. 4 depicts a TEM image at 200 nm of epitaxial silicon grown with a confining tab, in accordance with an embodiment of the present invention.
Figure 5:
FIG. 5 depicts a TEM image at 50 nm of epitaxial silicon grown with a confining tab, in accordance with an embodiment of the present invention.

In a container comprising a liner material over a silicon substrate, the base of the container is etched in accordance with an embodiment of the present invention to create a confining tab and to expose the silicon substrate. Epitaxial silicon is subsequently grown in the container. As illustrated in FIGS. 4–5, the confining tab controls the bottom stacking fault propagations by directing the propagations towards the container sidewalls thereby substantially eliminating bottom stacking faults that extend to the top surface of the epitaxial silicon.

The invention claimed is:

1. A method of growing epitaxial silicon, comprising:
providing a silicon substrate that supports a container comprising a liner, wherein the liner is over the silicon substrate;
etching the base of the liner to create a confining tab and to expose the silicon substrate; and
growing silicon epitaxially in the container.

2. The method as claimed in claim 1 wherein the liner comprises a metal nitride or a metal oxide.

3. The method as claimed in claim 1 wherein the silicon substrate is comprised of a material selected from the group consisting of doped single crystal silicon, undoped single crystal silicon, epitaxial silicon, polysilicon, and amorphous silicon.

4. The method as claimed in claim 1 in which said liner comprises sidewalls and a base and said confining tab extends inwardly from said sidewalls of said liner.

5. A method of growing epitaxial silicon, comprising:
providing a silicon substrate that supports a container comprising a liner, wherein the liner is over the silicon substrate;
etching the sidewalls and a portion of the base of the liner to create a confining tab and to expose the silicon substrate; and
growing silicon epitaxially in the container.

6. The method as claimed in claim 5 wherein the liner comprises a metal nitride or a metal oxide.

7. The method as claimed in claim 5 wherein the silicon substrate is comprised of a material selected from the group consisting of doped single crystal silicon, undoped single crystal silicon, epitaxial silicon, polysilicon, and amorphous silicon.

8. The method as claimed in claim 5 in which said confining tab extends inwardly from said sidewalls of said liner.

9. A method of growing epitaxial silicon, comprising:
providing a silicon substrate that supports a container comprising a liner, wherein the liner is at the base of the container over the silicon substrate;
etching the liner to create a confining tab and to expose the silicon substrate; and
growing silicon epitaxially in the container.

10. The method as claimed in claim 9 wherein the liner comprises a metal nitride or a metal oxide.

11. The method as claimed in claim 9 wherein the silicon substrate is comprised of a material selected from the group consisting of doped single crystal silicon, undoped single crystal silicon, epitaxial silicon, polysilicon, and amorphous silicon.

12. The method as claimed in claim 9 in which said liner comprises sidewalls and a base and said confining tab extends inwardly from said sidewalls of said liner.

13. A method of growing epitaxial silicon, comprising:
providing a silicon substrate that supports a container comprising a liner, wherein the liner is over the silicon substrate;
etching the base of the liner to create a confining tab and to expose the silicon substrate;
forming a plasma from a gas flow, wherein the gas flow comprises an etchant gas;
exposing the silicon substrate to the plasma; and
growing silicon epitaxially in the container.

14. The method as claimed in claim 13 wherein the liner comprises a metal nitride or a metal oxide.

15. The method as claimed in claim 13 wherein the silicon substrate is comprised of a material selected from the group consisting of doped single crystal silicon, undoped single crystal silicon, epitaxial silicon, polysilicon, and amorphous silicon.

16. The method as claimed in claim 13 wherein the etchant gas comprises a halogen.

17. The method as claimed in claim 13 wherein the silicon substrate is exposed to the plasma from about 1 to about 2 minutes.

18. A method of growing epitaxial silicon, comprising:
providing a silicon substrate that supports a container comprising a liner, wherein the liner is over the silicon substrate;
etching the sidewalls and a portion of the base of the liner to create a confining tab and to expose the silicon substrate;
forming a plasma from a gas flow, wherein the gas flow comprises an etchant gas;
exposing the silicon substrate to the plasma; and
growing silicon epitaxially in the container.

19. The method as claimed in claim 18 wherein the liner comprises a metal nitride or a metal oxide.

20. The method as claimed in claim 18 wherein the silicon substrate is comprised of a material selected from the group consisting of doped single crystal silicon, undoped single crystal silicon, epitaxial silicon, polysilicon, and amorphous silicon.

21. The method as claimed in claim 18 wherein the etchant gas comprises a halogen.

22. The method as claimed in claim 18 wherein the silicon substrate is exposed to the plasma from about 1 to about 2 minutes.

23. The method as claimed in claim 18 in which said confining tab extends inwardly from said sidewalls of said liner.

24. A method of growing epitaxial silicon, comprising:
providing a silicon substrate that supports a container comprising a liner, wherein the liner is at the base of the container over the silicon substrate;
etching the liner to create a confining tab and to expose the silicon substrate;

forming a plasma from a gas flow, wherein the gas flow comprises an etchant gas;
exposing the silicon substrate to the plasma; and
growing silicon epitaxially in the container.

25. The method as claimed in claim 24 wherein the liner comprises a metal nitride or a metal oxide.

26. The method as claimed in claim 24 wherein the silicon substrate is comprised of a material selected from the group consisting of doped single crystal silicon, undoped single crystal silicon, epitaxial silicon, polysilicon, and amorphous silicon.

27. The method as claimed in claim 24 wherein the etchant gas comprises a halogen.

28. The method as claimed in claim 24 wherein the silicon substrate is exposed to the plasma from about 1 to about 2 minutes.

29. The method as claimed in claim 24 in which said liner comprises sidewalls and a base and said confining tab extends inwardly from said sidewalls of said liner.

30. A method for controlling bottom stacking fault propagation in epitaxial silicon, comprising:
providing a silicon substrate that supports a container comprising a liner, wherein the liner is over the silicon substrate;
etching the base of the liner to create a confining tab and to expose the silicon substrate; and
growing silicon epitaxially in the container, wherein bottom stacking fault propagations are controlled.

31. The method as claimed in claim 30 wherein the liner comprises a metal nitride or a metal oxide.

32. The method as claimed in claim 30 wherein the silicon substrate is comprised of a material selected from the group consisting of doped single crystal silicon, undoped single crystal silicon, epitaxial silicon, polysilicon, and amorphous silicon.

33. The method as claimed in claim 30 wherein the silicon substrate is exposed to the plasma from about 1 to about 2 minutes.

34. The method as claimed in claim 30 wherein the bottom stacking fault propagations are controlled by driving the stacking faults to the sidewalls of the container, by terminating the stacking faults on themselves or combinations thereof.

35. A method for controlling bottom stacking fault propagation in epitaxial silicon, comprising:
providing a silicon substrate that supports a container comprising a liner, wherein the liner is over the silicon substrate;
etching the sidewalls and a portion of the base of the liner to create a confining tab and to expose the silicon substrate; and
growing silicon epitaxially in the container, wherein bottom stacking fault propagations are controlled.

36. The method as claimed in claim 35 wherein the liner comprises a metal nitride or a metal oxide.

37. The method as claimed in claim 35 wherein the silicon substrate is comprised of a material selected from the group consisting of doped single crystal silicon, undoped single crystal silicon, epitaxial silicon, polysilicon, and amorphous silicon.

38. The method as claimed in claim 35 wherein the bottom stacking fault propagations are controlled by driving the stacking faults to the sidewalls of the container, by terminating the stacking faults on themselves or combinations thereof.

39. A method for controlling bottom stacking fault propagation in epitaxial silicon, comprising:
providing a silicon substrate that supports a container comprising a liner, wherein the liner is at the base of the container over the silicon substrate;
etching the liner to create a confining tab and to expose the silicon substrate; and
growing silicon epitaxially in the container, wherein bottom stacking fault propagations are controlled.

40. The method as claimed in claim 39 wherein the liner comprises a metal nitride or a metal oxide.

41. The method as claimed in claim 39 wherein the silicon substrate is comprised of a material selected from the group consisting of doped single crystal silicon, undoped single crystal silicon, epitaxial silicon, polysilicon, and amorphous silicon.

42. The method as claimed in claim 39 wherein the bottom stacking fault propagations are controlled by driving the stacking faults to the sidewalls of the container, by terminating the stacking faults on themselves or combinations thereof.

43. A method for controlling bottom stacking fault propagation in epitaxial silicon, comprising:
providing a silicon substrate that supports a container comprising a liner, wherein the liner is over the silicon substrate;
etching the base of the liner to create a confining tab and to expose the silicon substrate;
forming a plasma from a gas flow, wherein the gas flow comprises an etchant gas;
exposing the silicon substrate to the plasma; and
growing silicon epitaxially in the container, wherein bottom stacking fault propagations are controlled.

44. The method as claimed in claim 43 wherein the liner comprises a metal nitride or a metal oxide.

45. The method as claimed in claim 43 wherein the silicon substrate is comprised of a material selected from the group consisting of doped single crystal silicon, undoped single crystal silicon, epitaxial silicon, polysilicon, and amorphous silicon.

46. The method as claimed in claim 43 wherein the etchant gas comprises a halogen.

47. The method as claimed in claim 43 wherein the silicon substrate is exposed to the plasma from about 1 to about 2 minutes.

48. The method as claimed in claim 43 wherein the bottom stacking fault propagations are controlled by driving the stacking faults to the sidewalls of the container, by terminating the stacking faults on themselves or combinations thereof.

49. A method for controlling bottom stacking fault propagation in epitaxial silicon substrate, comprising:
providing a silicon substrate that supports a container comprising a liner, wherein the liner is over the silicon substrate;
etching the sidewalls and a portion of the base of the liner to create a confining tab and to expose the silicon substrate;
forming a plasma from a gas flow, wherein the gas flow comprises an etchant gas;
exposing the silicon substrate to the plasma; and
growing silicon epitaxially in the container, wherein bottom stacking fault propagations are controlled.

50. The method as claimed in claim 49 wherein the liner comprises a metal nitride or a metal oxide.

51. The method as claimed in claim 49 wherein the silicon substrate is comprised of a material selected from the group consisting of doped single crystal silicon, undoped single crystal silicon, epitaxial silicon, polysilicon, and amorphous silicon.

52. The method as claimed in claim 49 wherein the etchant gas comprises a halogen.

53. The method as claimed in claim 49 wherein the silicon substrate is exposed to the plasma from about 1 to about 2 minutes.

54. The method as claimed in claim 49 wherein the bottom stacking fault propagations are controlled by driving the stacking faults to the sidewalls of the container, by terminating the stacking faults on themselves or combinations thereof.

55. A method for controlling bottom stacking fault propagation in epitaxial silicon, comprising:
  providing a silicon substrate that supports a container comprising a liner, wherein the liner is at the base of the container over the silicon substrate;
  etching the liner to create a confining tab and to expose the silicon substrate;
  forming a plasma from a gas flow, wherein the gas flow comprises an etchant gas;
  exposing the silicon substrate to the plasma; and
  growing silicon epitaxially in the container, wherein bottom stacking fault propagations are controlled.

56. The method as claimed in claim 55 wherein the liner comprises a metal nitride or a metal oxide.

57. The method as claimed in claim 55 wherein the silicon substrate is comprised of a material selected from the group consisting of doped single crystal silicon, undoped single crystal silicon, epitaxial silicon, polysilicon, and amorphous silicon.

58. The method as claimed in claim 55 wherein the etchant gas comprises a halogen.

59. The method as claimed in claim 55 wherein the silicon substrate is exposed to the plasma from about 1 to about 2 minutes.

60. The method as claimed in claim 55 wherein the bottom stacking fault propagations are controlled by driving the stacking faults to the sidewalls of the container, by terminating the stacking faults on themselves or combinations thereof.

* * * * *